US 6,560,108 B2

(12) United States Patent
Lo et al.

(10) Patent No.: US 6,560,108 B2
(45) Date of Patent: *May 6, 2003

(54) CHIP SCALE PACKAGING ON CTE MATCHED PRINTED WIRING BOARDS

(75) Inventors: Ching P. Lo, Rancho Palos Verdes; Daniel A. Huang, West Hills; Pete Hudson, Escondido, all of CA (US)

(73) Assignee: Hughes Electronics Corporation, El Segundo, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/504,637

(22) Filed: Feb. 16, 2000

(65) Prior Publication Data

US 2001/0046120 A1 Nov. 29, 2001

(51) Int. Cl.[7] .................................................. H05K 7/20
(52) U.S. Cl. ........................ 361/704; 361/702; 257/707; 174/16.3
(58) Field of Search ................................. 361/700–709, 361/717–719, 767–768, 749–751, 771, 820, 747, 760–769, 783, 766, 784, 686; 257/706–727, 778, 780, 627, 737, 249, 738, 741, 748–750, 782, 788, 783–784, 753; 174/16.3, 252, 254, 255, 259; 438/118, 119, 128, 107, 108, 110, 612–614, 616–617; 228/180.22, 104, 189, 56.3; 29/832, 840

(56) References Cited

U.S. PATENT DOCUMENTS

| | | | |
|---|---|---|---|
| 4,658,332 A | * 4/1987 | Baker et al. ................ 361/398 |
| 4,847,146 A | * 7/1989 | Yeh et al. .................... 428/413 |
| 4,933,808 A | * 6/1990 | Horton et al. ............... 361/336 |
| 5,010,038 A | * 4/1991 | Fox et al. .................... 437/215 |
| 5,474,458 A | * 12/1995 | Vafi et al. ..................... 439/91 |
| 5,477,611 A | * 12/1995 | Sweis et al. .................. 29/840 |
| 5,659,952 A | * 8/1997 | Kovac et al. ................. 29/840 |
| 5,683,942 A | * 11/1997 | Kata et al. .................. 437/209 |
| 5,821,624 A | * 10/1998 | Pasch ......................... 257/776 |
| 5,858,537 A | * 1/1999 | Brown et al. ............... 428/408 |
| 5,900,674 A | * 5/1999 | Woinarowski et al. ...... 257/774 |
| 5,953,210 A | * 9/1999 | Lo .............................. 361/704 |
| 5,971,253 A | * 10/1999 | Gilleo et al. .......... 228/180.224 |
| 5,990,545 A | * 11/1999 | Schueller et al. ........... 257/697 |
| 6,020,220 A | * 2/2000 | Gilleo et al. ............... 438/119 |
| 6,049,128 A | * 4/2000 | Kitano et al. .............. 257/737 |
| 6,064,217 A | * 5/2000 | Smith ......................... 324/760 |
| 6,108,210 A | * 8/2000 | Chung ........................ 361/747 |
| 6,114,763 A | * 9/2000 | Smith ......................... 257/738 |
| 6,133,072 A | * 10/2000 | Fjestad ....................... 438/128 |

* cited by examiner

*Primary Examiner*—Darren Schuberg
*Assistant Examiner*—Michael Datskovsky
(74) *Attorney, Agent, or Firm*—Terje Gudmestad

(57) ABSTRACT

A circuit assembly has a heat sink assembly and a chip scale package assembly. The chip scale package assembly has an integrated circuit die coupled to a first printed wiring board. The heat sink assembly has an integrated circuit die coupled to a second printed wiring board. Preferably, the heat sink assembly and the chip scale package assembly are assembled separately then assembled together. The circuit pads on the first printed wiring board correspond with circuit pads on the second printed wiring board. The circuit pads may be coupled together by solder or adhesive bonding. The circuit pads on the first printed wiring board may have solder balls formed of high temperature solder that do not melt when the heat sink assembly is assembled with chip scale package assembly. The solder balls allow chip scale package assembly to maintain a predetermined distance from the circuit pads on the second printed wiring board.

5 Claims, 1 Drawing Sheet

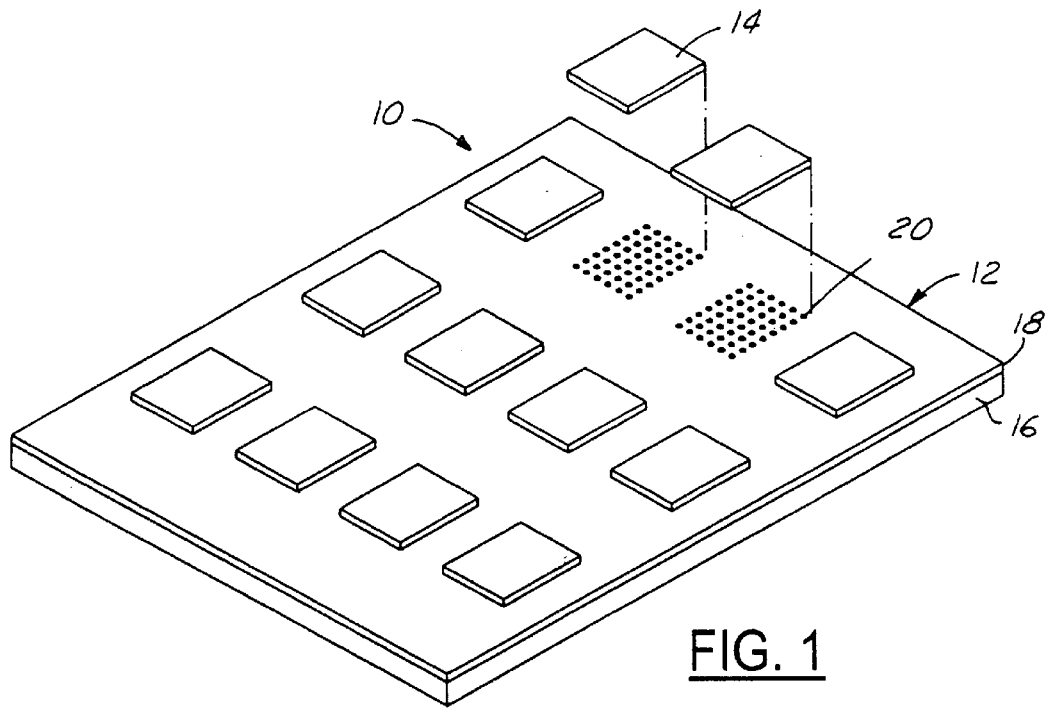
FIG. 1
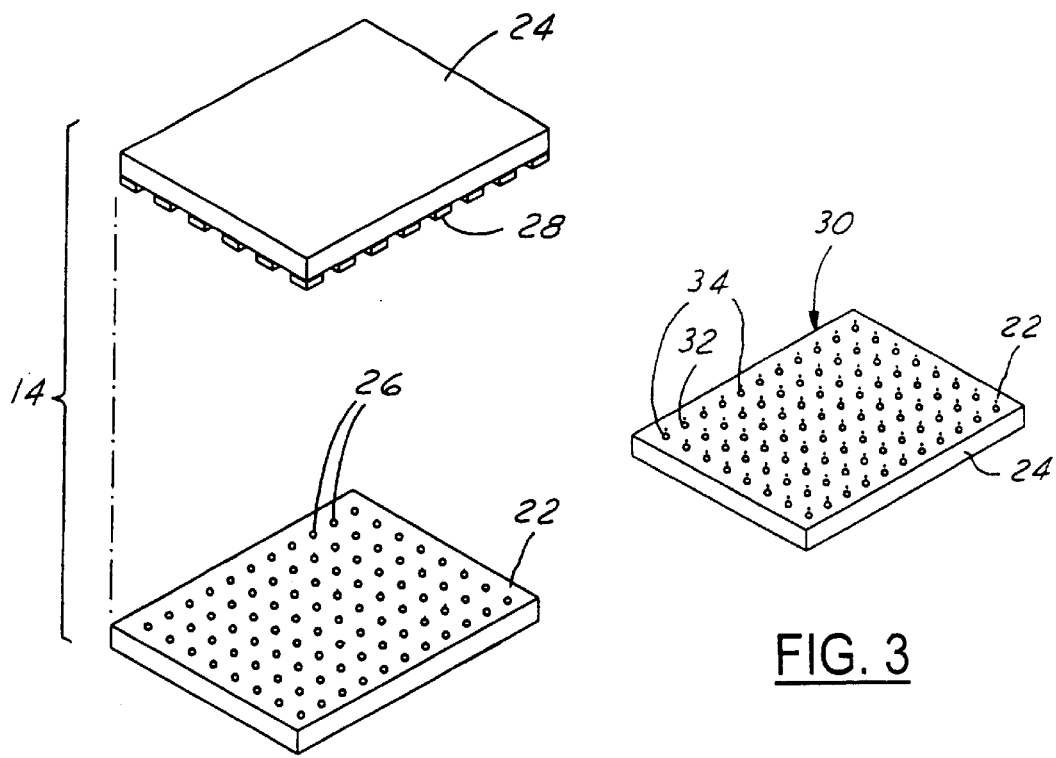
FIG. 2
FIG. 3

CHIP SCALE PACKAGING ON CTE MATCHED PRINTED WIRING BOARDS

TECHNICAL FIELD

The present invention a chip scale packaging, and more particularly to a low cost and high performance chip scale package mounted to a highly thermal conductive printed wiring board (PWB) assembly

BACKGROUND ART

In order to package more electronic components in a limited space, electronic components have become smaller and smaller. For the active devices, integrated circuits (ICs), the package size has been reduced from dual in-line packages (DIPs) to flatpacks, to leadless chip carriers (LCCs), to chip-on-board (COB), and to flip chip. One of the smallest active components is the flip chip die. In a flip chip die, the IC die is flipped and soldered to the PWB directly to achieve one of the highest packaging densities. One problem with flip chip dice is that not all of the existing IC dice can be used with this technology due to small bond pad pitch and bumping requirements. To solve this problem, chip scale packaging technology (CSP) was invented. The chip scale package adds a redistribution layer to an existing die and to add some adhesive layers on the top of the IC die bond pads to protect the aluminum pads from corrosion. The redistribution layer is used to redistribute the small pitched peripheral IC bond pads to a large pitched area array solder pads; these solder pads are used to form micro ball grid array ($\mu$BGA). The $\mu$BGA can be soldered to the PWB with standard surface mount technology (SMT) soldering process.

There are many ways to convert an IC die to a CSP. The easiest way to package a CSP is to attach a redistribution layer on the top of the die. The $\mu$BGA are placed on the other side of the redistribution layer for soldering purposes. The problem with this kind of approach is that the coefficient of thermal expansion (CTE) of the CSP (~3 PPM/° C.) is much smaller than the PWB material (~14PPM/° C.). Large CTE mismatch will cause the solder joints between the CSP and PWB to fail.

One of the most popular and most reliable CSP devices are made by a company called Tessera (3099 Orchard Dr., San Jose, Calif. 95134). The Tessera CSP uses a specially designed compliant device to decouple the effect of the low CTE die from the redistribution layer. The redistribution layer has the similar CTE as the PWB. The stress caused by the small CTE mismatch between the redistribution layer of the CSP and PWB is very low, long life is expected on the solder joints. One problem with this type of CSP is that the associated non-recurring cost to design and fabricate the package is high. If the quantity usage of this package is high, the nonrecurring cost can be amortized over the large quantity. However, if many different kinds of ICs are used, and the quantities of each IC are small, then, it will be non-economical and unpractical to use this technology. Besides cost issues associated with ordinary CSP, heat transfer may be another serious consideration. The device used in many reliable CSPs will not only decouple the CTE from the IC dice, but also decouple the heat transfer path and increase signal path to the PWB. When the functionality and speed of the ICs are increased, this kind of device may not serve the purpose.

SUMMARY OF THE INVENTION

It is, therefore, one object of the invention to increase reliability of an integrated circuit mounted to a printed wiring board by reducing the stress between the interconnects between the die and the printed wiring board.

In one aspect of the invention, a circuit assembly has a die with a plurality of die pads. A first circuit layer has a first side and a second side. The first side has a first plurality of circuit pads coupled to the plurality of die pads. The second side has a second plurality of circuit pads. A second circuit layer is coupled to a heat sink. The second circuit layer has a third plurality of circuit pads coupled to the second plurality of circuit pads.

In a further aspect of the invention, the first circuit layer and the second circuit layer are compliant. This allows stress to be released from the interconnects between the first circuit layer and the second circuit layer.

In a further aspect of the invention, the coefficient of thermal expansion (CTE) of the heat sink and the die are as closely matched as possible to reduce stress in the interconnect.

In another aspect of the invention, a method of assembling a circuit comprises the steps of: coupling a die to a first side of a first circuit layer to form a chip scale package assembly; bonding a second circuit layer to a heat sink to form a heat sink assembly; and, coupling the first circuit layer to a second circuit layer.

One advantage of the invention is that underfill, which is commonly required between an integrated circuit die and a small, flexible printed wiring board may be eliminated. This reduces the cost and cycle time of the assembly process time while increasing the reliability of the assembly.

Other objects and features of the present invention will become apparent when viewed in light of the detailed description of the preferred embodiment when taken in conjunction with the attached drawings and appended claims.

BRIEF DESCRIPTION OF THE DRAWINGS

FIG. 1 is a partially exploded perspective view of a circuit assembly according to the present invention.

FIG. 2 is an exploded perspective view of a chip scale package portion of a printed wiring board.

FIG. 3 is a perspective view showing the underside of the assembled chip scale package of FIG. 2.

BEST MODE(S) FOR CARRYING OUT THE INVENTION

The present invention my be applied to circuit assemblies used in automotive, space and other commercial industries having thermal dissipation concerns with respect to electronic assemblies.

Referring to FIG. 1, a circuit assembly 10 has a heat sink assembly 12 and preferably several chip scale package assemblies 14. One or more chip scale package assemblies 14 may be included on a single printed wiring board assembly 12. Heat sink assembly 12 has a heat sink 16 and a printed wiring board 18. Printed wiring board 18 is also known in the art as a printed wiring board or printed circuit board.

Heat sink 16 is preferably made of a high thermally conducting material such as copper invar copper, carbon graphite, graphite aluminum, or diamond. Heat sink 16 is also preferably has a low CTE. Heat sink 16 is sized to extend at least under the area of printed wiring board 18 that has chip scale package assemblies 14 mounted thereto.

Printed wiring board 18 is securely mounted to heat sink 16. That is, printed wiring board may be hard bonded to heat sink 16. The expansion or shrinkage of printed wiring board 18 is constrained by the CTE of heat sink 16. Printed wiring board 18 is preferably a flexible or compliant printed wiring board. If printed wiring board 18 is a multilayer board, at least the outer layers are preferably compliant. Printed wiring board 18 has circuit traces that are used for electrical interconnections within itself and for electrical connections to other component and circuits in a conventional manner. Printed wiring board 18 has a plurality of solder or circuit pads 20 that electrically connect chip scale package assembly 14 with the conductive traces contained within printed wiring board 18.

As will be further described below, chip scale package assemblies 14 may be mounted to the surface of printed wiring board 18 by soldering or by conductive adhesives such as epoxy.

Referring now to FIG. 2, an exploded view of a chip scale package assembly 14 is shown. Chip scale assembly package 14 has another circuit layer such as a redistribution layer 22 coupled to a silicon chip or integrated circuit die 24. Redistribution layer 22 is preferably a thin, small flexible or compliant circuit board that is sized about the same size as integrated circuit die 24. One example of a suitable material for redistribution layer 22 is polyimide. Redistribution layer preferably has about the same coefficient of thermal expansion as printed wiring board 18 and die 24. Redistribution layer 22 has two sides. The side adjacent to integrated circuit die 24 has a plurality of circuit pads 26. Circuit pads 26 are preferably made from an electrically conductive material, such as copper or aluminum.

Integrated circuit die 24 has a plurality of die pads 28 located on one side thereof. Circuit pads 26 of redistribution layer 22 align with die pads 28. Die pads 28 are preferably coupled to circuit pads 26 by a high temperature solder. Other means for coupling circuit pads 26 to die pads 28 may include the use of a conductive adhesive, such as conductive epoxy.

Die 24 is preferably a "bullet-proof die," meaning that the circuits have been passivated using a protection coating such as silicon nitride or a P-glass and that die pads 28 are plated with a protection metal such as nickel or gold.

Referring now to FIG. 3, a view of the underside 30 of redistribution layer 22 is shown. Redistribution layer 22 is shown coupled to integrated circuit die 24. Underside 30 of redistribution layer 22 has a plurality of circuit pads 32 that align with circuit pads 20 on printed wiring board 18 of heat sink assembly 12. Circuit pads 32 may have balls 34 of high temperature solder formed thereon as described below. Preferably, chip scale package assembly 14 is assembled prior to its assembly with printed wiring board assembly 12.

In operation, heat sink assembly 12 is assembled by mounting printed wiring board 18 to heat sink 16. This may be done by applying adhesive between heat sink 16 and printed wiring board 18 or by thermally bonding printed wiring board 18 to heat sink 12. Solder paste or other adhesives are screen printed onto circuit pads 20.

Chip scale package assembly 14 is assembled by placing high temperature solder on circuit pads 26 of redistribution layer 22. Integrated circuit die 24 is brought into contact with the screen printed solder and reflowed so that die pads 24 are electrically coupled and physically coupled to circuit pads 22.

In addition to applying solder to circuit pads 22, circuit pads 32 may also have high temperature solder applied thereto. This high temperature solder when reflowed will form balls 34 of high temperature solder on circuit pads 32.

Chip scale package assembly 14 is then assembled to heat sink assembly 12. The chip scale package assembly 14 may be assembled to heat sink assembly 12 using solder or an adhesive. Preferably, a solder or adhesive having a lower temperature than that previously applied to circuit pads 26 is used. This allows the balls formed of the high temperature solder on circuit pads 32 to hold integrated circuit die 24 at a constant distance from printed wiring board 18.

By assembling chip scale package assembly 14 prior to assembly to heat sink assembly, chip scale package assembly 14 may be burned-in and tested.

As would be evident to those skilled in the art, by providing a redistribution layer 22 the same size as die 24, the highest packaging density of chip scale package assemblies 14 on heat sink assembly 12 may be achieved.

Even though the CTEs of the printed wiring board, the die and the redistribution layer are close, localized expansion may occur. The compliant printed wiring board 18 allows localized thermal expansion to occur to prevent stress in the solder joints.

While particular embodiments of the invention have been shown and described, numerous variations and alternate embodiments will occur to those skilled in the art. Accordingly, it is intended that the invention be limited only in terms of the appended claims.

What is claimed is:

1. A circuit assembly, comprising:
    a die having a plurality of die pads, said die having a first coefficient of thermal expansion;
    a first compliant circuit layer having a first side and a second side, said first side having a first plurality of circuit pads coupled to said plurality of die pads and said second side having a second plurality of circuit pads, said first compliant circuit layer having a second coefficient of thermal expansion;
    a heat sink assembly having a heat sink; and
    a second circuit board layer coupled to said heat sink, said second circuit layer having a third plurality of circuit pads coupled to said second plurality of circuit pads, said assembly of the heat sink and said second circuit layer having a third coefficient of thermal expansion
    wherein said first, second and third coefficients of thermal expansion, equal.

2. A circuit assembly as recited in claim 1 wherein said second plurality of circuit pads and said third plurality of circuit pads are solder coupled.

3. A circuit assembly as recited in claim 1 wherein said second plurality of circuit pads and said third plurality of circuit pads are adhesively coupled.

4. A circuit assembly as recited in claim 1 further comprising a plurality of high temperature solder balls coupled to said second plurality of circuit pads.

5. A circuit assembly as recited in claim 1 wherein said die has a first area and said first compliant circuit board layer has a second area substantially equal or less than said first area.

* * * * *

UNITED STATES PATENT AND TRADEMARK OFFICE
CERTIFICATE OF CORRECTION

PATENT NO.     : 6,560,108 B2
DATED          : May 6, 2003
INVENTOR(S)    : Ching P. Lo et al.

It is certified that error appears in the above-identified patent and that said Letters Patent is hereby corrected as shown below:

<u>Column 4,</u>
Lines 32-49, claim 1 should read:

1. A circuit assembly, comprising:
a die having a plurality of die pads, said die having a first coefficient of thermal expansion;
a first compliant circuit layer having a first side and a second side, said first side having a first plurality of circuit pads coupled to said plurality of die pads and said second side having a second plurality of circuit pads, said first compliant circuit layer having a second coefficient of thermal expansion;
a heat sink assembly having a heat sink; and
a second circuit board layer coupled to said heat sink, said second circuity layer having a third plurality of circuit pads coupled to said second plurality of circuit pads, said assembly of the heat sink and said second circuit layer having a third coefficient of thermal expansion wherein said first, second and third coefficients of thermal expansion are substantially equal.

Signed and Sealed this

Ninth Day of September, 2003

JAMES E. ROGAN
*Director of the United States Patent and Trademark Office*